United States Patent
Li et al.

(10) Patent No.: US 11,476,362 B2
(45) Date of Patent: Oct. 18, 2022

(54) VERTICAL TRANSISTORS WITH VARIOUS GATE LENGTHS

(71) Applicant: International Business Machines Corporation, Armonk, NY (US)

(72) Inventors: Juntao Li, Cohoes, NY (US); Kangguo Cheng, Schenectady, NY (US); ChoongHyun Lee, Rensselaer, NY (US); Shogo Mochizuki, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 16/806,189

(22) Filed: Mar. 2, 2020

(65) Prior Publication Data

US 2020/0203528 A1    Jun. 25, 2020

Related U.S. Application Data

(62) Division of application No. 16/023,535, filed on Jun. 29, 2018, now Pat. No. 10,665,714.

(51) Int. Cl.
| | |
|---|---|
| *H01L 29/78* | (2006.01) |
| *H01L 21/8234* | (2006.01) |
| *H01L 29/66* | (2006.01) |
| *H01L 27/088* | (2006.01) |
| *H01L 29/10* | (2006.01) |

(52) U.S. Cl.
CPC .. *H01L 29/7827* (2013.01); *H01L 21/823468* (2013.01); *H01L 21/823487* (2013.01); *H01L 27/088* (2013.01); *H01L 29/1033* (2013.01); *H01L 29/6656* (2013.01)

(58) Field of Classification Search
CPC ............. H01L 29/7827; H01L 29/1033; H01L 29/6656; H01L 29/0847; H01L 29/66666; H01L 21/823468; H01L 21/823487; H01L 21/823418; H01L 21/823412; H01L 27/088
USPC ......................................................... 257/329
See application file for complete search history.

(56) References Cited

U.S. PATENT DOCUMENTS

| | | | |
|---|---|---|---|
| 8,637,849 | B2 | 1/2014 | Deligianni et al. |
| 9,378,975 | B2 | 6/2016 | Parkinson et al. |
| 9,397,226 | B2 | 7/2016 | Basu et al. |
| 9,437,503 | B1 | 9/2016 | Mallela et al. |
| 9,530,700 | B1 | 12/2016 | Mallela et al. |

(Continued)

OTHER PUBLICATIONS

List of IBM Patents or Patent Applications Treated as Related.

*Primary Examiner* — Xia L Cross
(74) *Attorney, Agent, or Firm* — Samuel Waldbaum; Ryan, Mason & Lewis, LLP

(57) ABSTRACT

A method for manufacturing a semiconductor device includes forming a plurality of fins on a semiconductor substrate. In the method, at least two spacer layers are formed around a first fin of the plurality of fins, and a single spacer layer is formed around a second fin of the plurality of fins. The at least two spacer layers include a first spacer layer including a first material and a second spacer layer including a second material different from the first material. The single spacer layer includes the second material. The method also includes selectively removing part of the first spacer layer to expose part the first fin, and epitaxially growing a source/drain region around the exposed part of the first fin.

18 Claims, 12 Drawing Sheets

(56) References Cited

U.S. PATENT DOCUMENTS

| | | |
|---|---|---|
| 9,530,866 B1 | 12/2016 | Zhang et al. |
| 9,570,356 B1 * | 2/2017 | Balakrishnan .... H01L 29/42356 |
| 9,741,716 B1 | 8/2017 | Cheng et al. |
| 9,935,018 B1 * | 4/2018 | Xie .................. H01L 21/823885 |
| 10,249,538 B1 * | 4/2019 | Qi ................... H01L 21/823456 |
| 2016/0056156 A1 | 2/2016 | Ghani et al. |
| 2017/0054027 A1 | 2/2017 | Liu |
| 2017/0178970 A1 | 6/2017 | Anderson et al. |
| 2018/0005895 A1 | 1/2018 | Cheng et al. |
| 2018/0005896 A1 | 1/2018 | Mallela et al. |
| 2018/0366372 A1 * | 12/2018 | Suvarna .............. H01L 29/0847 |
| 2019/0148372 A1 | 5/2019 | Miao et al. |
| 2019/0189625 A1 | 6/2019 | Cheng et al. |

* cited by examiner

VERTICAL TRANSISTORS WITH VARIOUS GATE LENGTHS

TECHNICAL FIELD

The field generally relates to semiconductor devices and methods of manufacturing same and, in particular, to forming vertical field effect transistor (VFETs) with different gate lengths on the same substrate.

BACKGROUND

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical field-effect transistors (VFETs) (also referred to as vertical transport field effect transistors (VTFETs)) are becoming viable device options for scaling semiconductor devices (e.g., complementary metal oxide semiconductor (CMOS) devices) to 5 nanometer (nm) node and beyond. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to address the limitations of horizontal device architectures in terms of, for example, density, performance, power consumption, and integration by, for example, decoupling gate length from the contact gate pitch, providing a FinFET-equivalent density at a larger contacted poly pitch (CPP), and providing lower MOL resistance.

Wimpy transistors, that is transistors with gate length ($L_{gate}$) slightly greater than nominal transistors, for example, a 3 nm increase of $L_{gate}$, are desired to reduce chip power consumption. However, it is difficult to incorporate wimpy FETs into VFET architecture due to challenges in aligning junctions with physical gates.

SUMMARY

According to an exemplary embodiment of the present invention, a method for manufacturing a semiconductor device includes forming a plurality of fins on a semiconductor substrate. In the method, at least two spacer layers are formed around a first fin of the plurality of fins, and a single spacer layer is formed around a second fin of the plurality of fins. The at least two spacer layers include a first spacer layer including a first material and a second spacer layer including a second material different from the first material. The single spacer layer includes the second material. The method also includes selectively removing part of the first spacer layer to expose part the first fin, and epitaxially growing a source/drain region around the exposed part of the first fin.

According to an exemplary embodiment of the present invention, a vertical transistor device includes a first vertical transistor comprising a first channel region on a semiconductor substrate, and a second vertical transistor comprising a second channel region on the semiconductor substrate. The first vertical transistor has a first gate length, and the second vertical transistor has a second gate length longer than the first gate length. Bottom source/drain regions are disposed adjacent bottom portions of each of the first and second channel regions. A height of the bottom source/drain region corresponding to the first channel region is greater than a height of the bottom source/drain region corresponding to the second channel region.

According to an exemplary embodiment of the present invention, a method for manufacturing a vertical transistor device includes forming a plurality of vertical channel regions on a semiconductor substrate. In the method, at least two spacer layers are formed around a first vertical channel region of the plurality of vertical channel regions, and a single spacer layer is formed around a second vertical channel region of the plurality of vertical channel regions. The at least two spacer layers include a first spacer layer including a first material and a second spacer layer including a second material different from the first material. The single spacer layer includes the second material. The method further includes selectively removing part of the first spacer layer to expose part the first vertical channel region, and epitaxially growing a source/drain region around the exposed part of the first vertical channel region.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
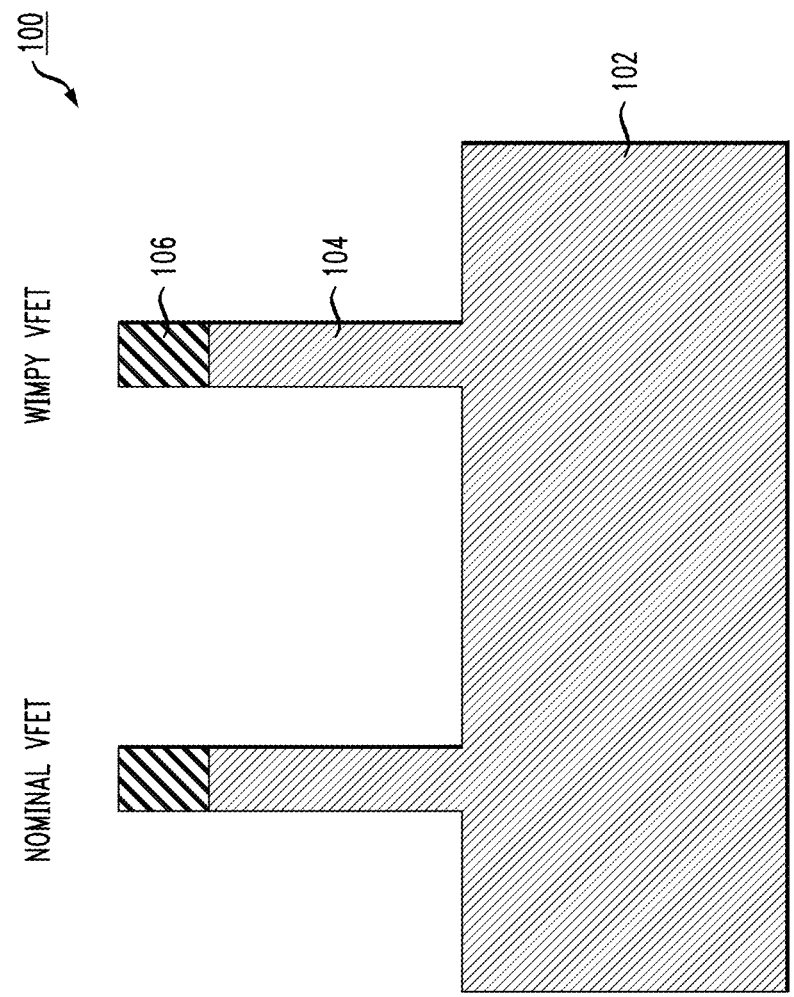
FIG. 1 is a cross-sectional view illustrating fin formation in a method of manufacturing a semiconductor device, according to an exemplary embodiment of the present invention.

Exemplary embodiments of the invention will now be discussed in further detail with regard to semiconductor devices and methods of manufacturing same and, in particular, to forming nominal and wimpy VFETs on the same chip.

It is to be understood that the various layers and/or regions shown in the accompanying drawings are not drawn to scale, and that one or more layers and/or regions of a type commonly used in, for example, FinFET, VFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VFETs, CMOSs, FETs, nanowire FETs, nanosheet FETs, SETs, and/or MOSFETs. By way of non-limiting example, the semiconductor devices can include, but are not necessarily limited to FinFET, VFET, CMOS, FET, nanowire FET, nanosheet FET, SET, CMOS and MOSFET devices, and/or semiconductor devices that use FinFET, VFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

In accordance with embodiments of the present invention two spacers in a nominal VFET device region and a single spacer in a wimpy VFET device region are used to form a VFET in the nominal VFET device region and a VFET in the wimpy VFET device region, wherein the VFET in the nominal VFET device region has a shorter gate length than the VFET in the wimpy VFET device region. Further, processing with the bilayer spacers in the nominal VFET device region results in an epitaxial source/drain region in the nominal VFET device region having stepped or L-shapes, causing an improved junction profile over conventional structures. The L-shaped epitaxial source/drain region is located on sides of the fin, allowing for a shorter diffusion length, resulting in faster dopant diffusion into the fin during junction annealing than in conventional structures. As a result, the embodiments of the present invention result in a lower diffusion gradient than in conventional arrangements.

The cross-sections in FIGS. 1-12 are taken perpendicular to the length of the fins along the substrate.

FIG. 1 is a cross-sectional view illustrating fin formation in a method of manufacturing a semiconductor device 100, according to an exemplary embodiment of the present invention. Referring to FIG. 1, a semiconductor substrate 102 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. The semiconductor substrate 102 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide.

Fins, such as fins 104, can be formed by patterning a portion of the semiconductor substrate 102 or a semiconductor layer on the substrate 102 into the fins 104. According to an embodiment, a hardmask 106 including, for example, a dielectric material, such as silicon nitride (SiN) is formed on portions of the semiconductor layer that are to be formed into the fins 104. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hard mask to form the fins by RIE processes. Alternatively, fin patterning can be done by any other suitable patterning technique, including but not limited to, lithography (e.g., extreme ultraviolet (EUV)) in conjunction with RIE, self-aligned double patterning (SADP), self-aligned multiple patterning (SAMP), and/or self-aligned quadruple patterning (SAQP)). While embodiments of the present invention describe channel regions as fins, the embodiments are not necessarily limited to fin channel regions, and may include nanowire channel regions.

FIG. 1 illustrates a fin 104 in a nominal VFET device region, and another fin 104 in a wimpy VFET device region. In a final structure, the wimpy VFET device region includes wimpy transistors, which, as noted above, are transistors with $L_{gate}$ greater than that of nominal transistors. In the final structure, the nominal VFET device region includes nominal transistors. The wimpy transistors reduce chip power consumption. Although two fins 104 are shown in the figures for ease of explanation, more than two fins can be formed, and more than one fin can be in each of the nominal and wimpy VFET device regions.

Figure 2:
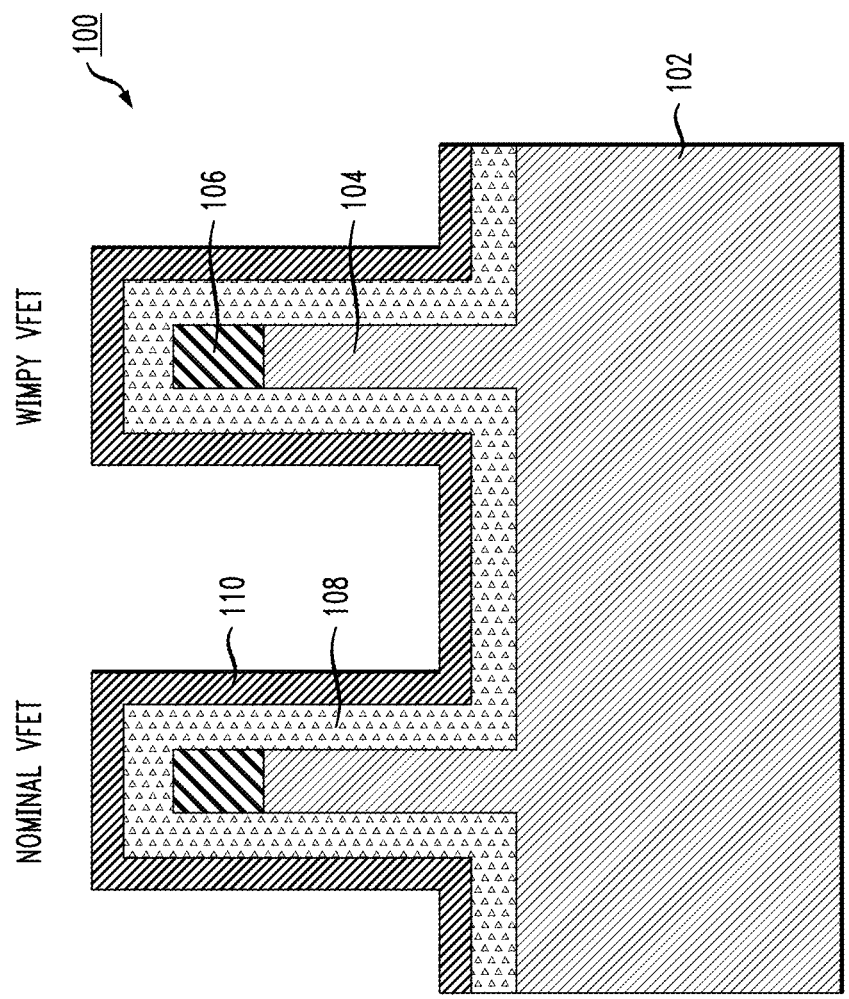
FIG. 2 is a cross-sectional view illustrating deposition of first and second dielectric layers in a method of manufacturing a semiconductor device, according to an exemplary embodiment of the present invention.

FIG. 2 is a cross-sectional view illustrating deposition of first and second dielectric layers in a method of manufacturing a semiconductor device, according to an exemplary embodiment of the present invention. Referring to FIG. 2, a first dielectric layer 108 is deposited on the fins 104, hardmasks 106 and on exposed surfaces of the substrate 102. Following the deposition of the first dielectric layer, a second dielectric layer 110 is deposited on the first dielectric layer 108. In accordance with an embodiment of the present invention, the first dielectric layer 108 comprises for example, silicon oxide ($SiO_x$), where x is, for example, 2 in the case of silicon dioxide ($SiO_2$), or 1.99 or 2.01, silicon oxycarbide (SiOC), silicon oxycarbonitride (SiOCN) or some other dielectric, and has a thickness of about 2 nm to about 5 nm, or about 5 nm to about 10 nm. In accordance with an embodiment of the present invention, the second dielectric layer 110 comprises for example, SiN, silicon boron nitride (SiBN), siliconborocarbonitride (SiBCN) or some other dielectric, and has a thickness of about 2 nm to about 5 nm, or about 5 nm to about 10 nm. The dielectric materials of the first and second dielectric layers 108 and 110 can vary, as long as the first and second dielectric layers 108 and 110 can be selectively etched with respect to each other. In an embodiment, the first dielectric 108 layer comprises $SiO_x$ and has a thickness of about 3 nm, and the second dielectric layer 110 comprises SiN and has a thickness of about 5 nm. The first and second dielectric layers 108 and 110 can be deposited using, for example, deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering.

Figure 3:
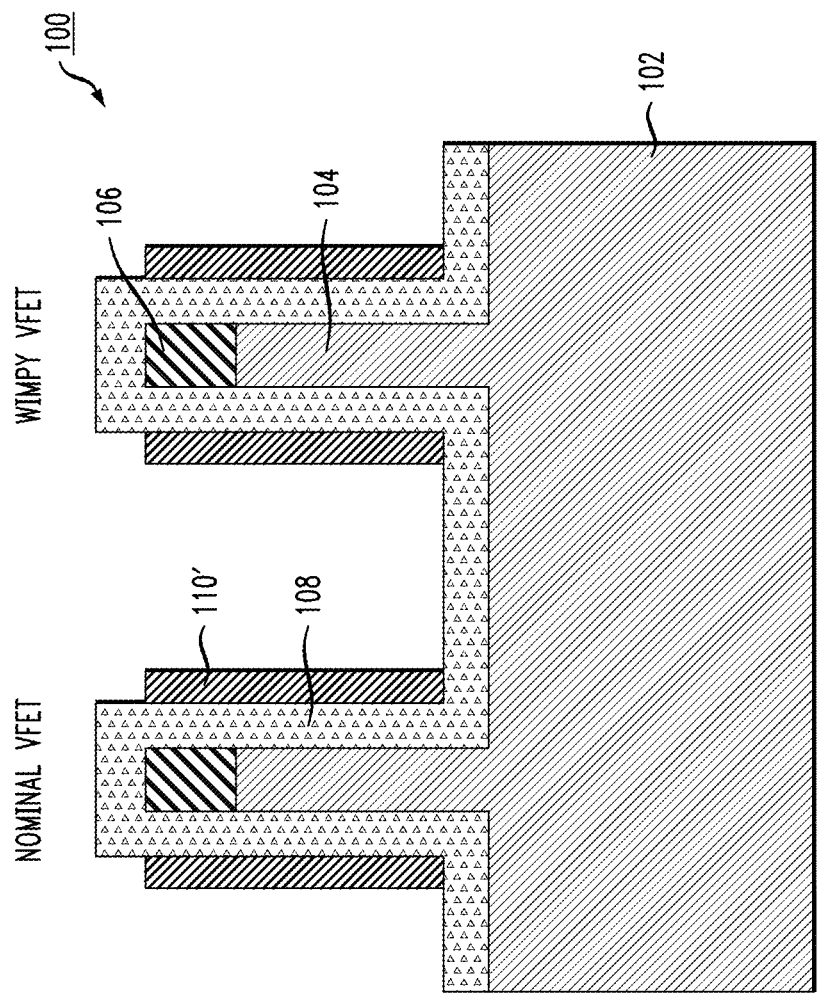
FIG. 3 is a cross-sectional view illustrating removal of portions of the second dielectric layer to form spacers in a method of manufacturing a semiconductor device, according to an exemplary embodiment of the present invention.

FIG. 3 is a cross-sectional view illustrating removal of portions of the second dielectric layer to form spacers in a method of manufacturing a semiconductor device, according to an exemplary embodiment of the present invention. Referring to FIG. 3, portions of the second dielectric layer 110 are removed to form spacers 110' remaining on the vertical surfaces of the first dielectric layer 108 on each of the fins 104 and hardmasks 106. For example, upper parts of vertical portions and horizontal portions of the second dielectric layer 110 are removed in an RIE process of the second dielectric layer 110. The RIE process can be performed using, for example, $CH_4$, $CHF_3$, or $CH_2F_2$ chemistry, which selectively removes the portions of the second dielectric layer 110, so that underlying portions of the first dielectric layer 108 remain.

Figure 4:
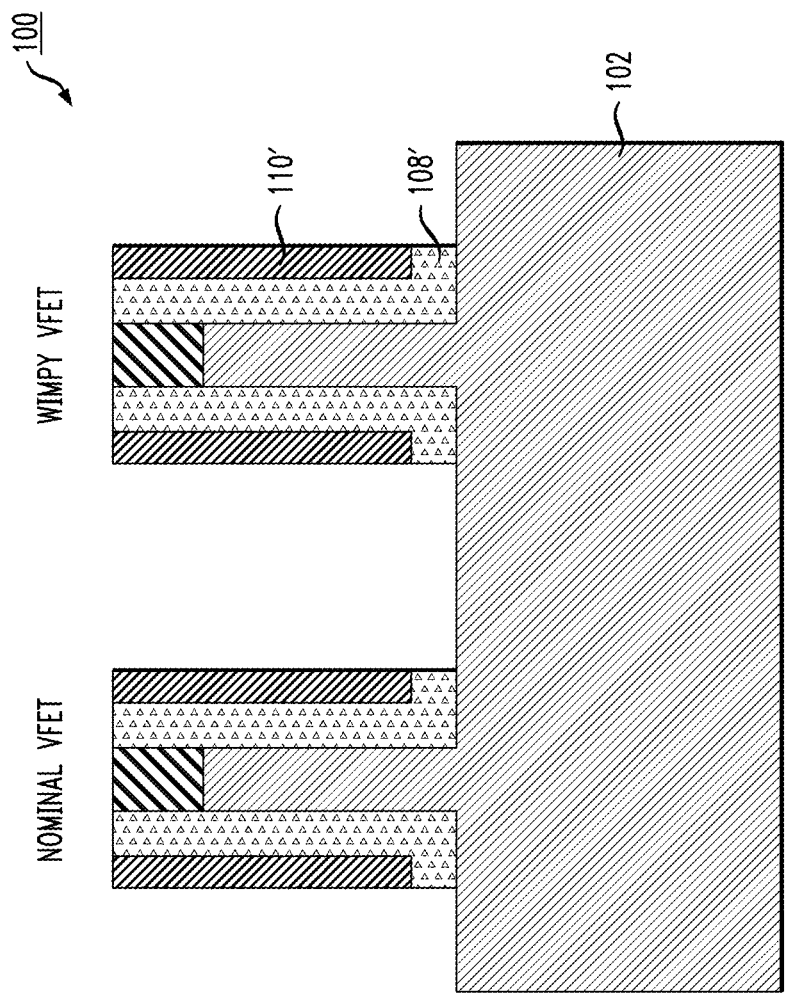
FIG. 4 is a cross-sectional view illustrating removal of portions of the first dielectric layer to form L-shaped spacers in a method of manufacturing a semiconductor device, according to an exemplary embodiment of the present invention.

FIG. 4 is a cross-sectional view illustrating removal of portions of the first dielectric layer to form L-shaped spacers in a method of manufacturing a semiconductor device, according to an exemplary embodiment of the present invention. Referring to FIG. 4, exposed horizontal portions of the first dielectric layer 108 are selectively removed with respect to the spacers 110' in an RIE process to form L-shaped spacers 108' on the vertical surfaces of each of the fins 104 and the hardmasks 106, and on part of the top surface of the substrate 102. The RIE process can be performed using, for example, $F/NH_3$ based dry etching, which selectively removes the exposed horizontal portions of the first dielectric layer 108 with respect to the spacers 110'. In the resulting structure, the spacers 108' are positioned between the spacers 110' and the fins and hardmasks 104 and 106, and between the spacers 110' and the substrate 102.

Figure 5:
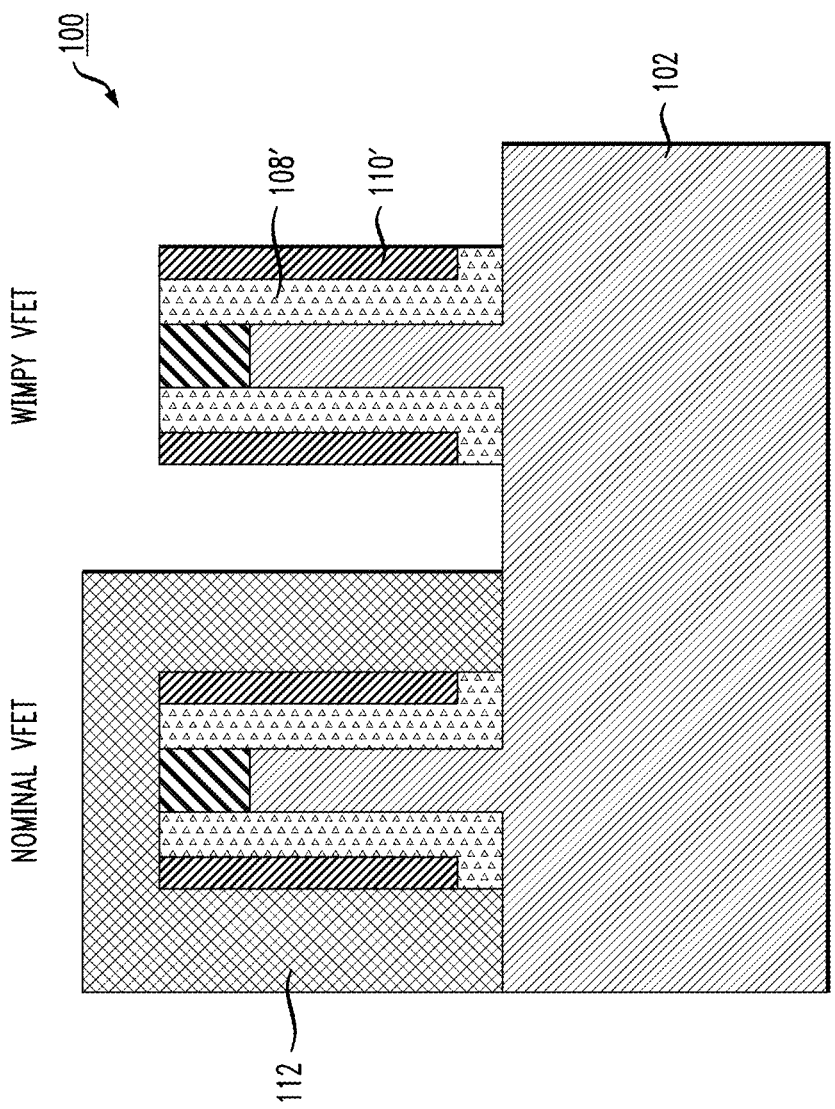
FIG. 5 is a cross-sectional view illustrating forming of a mask to cover a nominal VFET device region in a method of manufacturing a semiconductor device, according to an exemplary embodiment of the present invention.

FIG. 5 is a cross-sectional view illustrating forming of a mask to cover a nominal VFET device region in a method of manufacturing a semiconductor device, according to an exemplary embodiment of the present invention. Referring to FIG. 5, a mask 112 is formed over the structure from FIG. 4 in the nominal VFET device region, while leaving exposed the structure in the wimpy VFET device region. As discussed further in connection with FIG. 6, the mask 112 protects the underlying structure including the fin 104, hardmask 106 and spacers 108' and 110' in the nominal VFET device region while the spacers 108' and 110' are removed from the wimpy VFET device region. The mask 112 comprises, for example, soft mask materials such as a photoresist, organic planarizing layer (OPL), and/or hardmask materials such as amorphous carbon.

Figure 6:
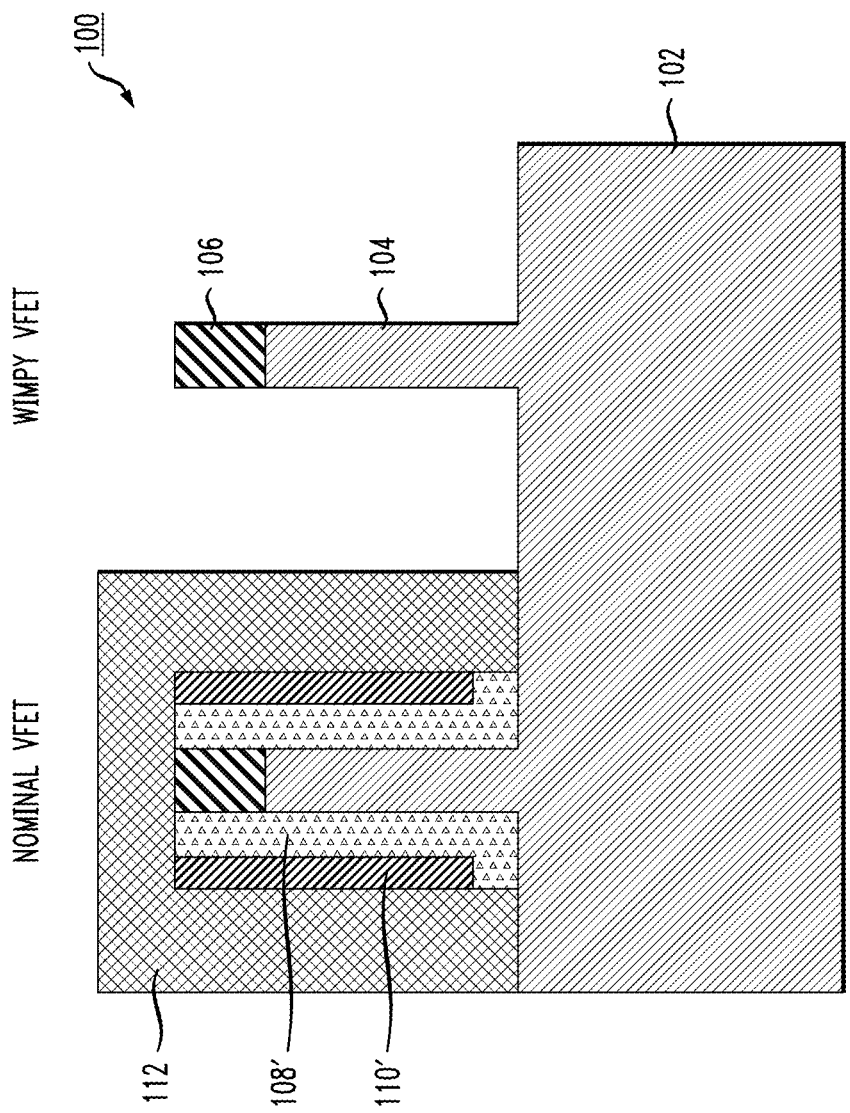
FIG. 6 is a cross-sectional view illustrating spacer removal from a wimpy VFET device region in a method of manufacturing a semiconductor device, according to an exemplary embodiment of the present invention.

FIG. 6 is a cross-sectional view illustrating spacer removal from a wimpy VFET device region in a method of manufacturing a semiconductor device, according to an exemplary embodiment of the present invention. Referring to FIG. 6, the spacers 108' and 110' (e.g., oxide and nitride spacers, respectively) of the exposed structure in the wimpy VFET device region are removed using, for example, hot phosphoric acid and diluted HF solution. In order to protect the spacers 108' and 110' in the nominal VFET device region, the mask 112 is resistant to the etchant used for removal of the spacers 108' and 110' from the wimpy VFET device region.

Figure 7:
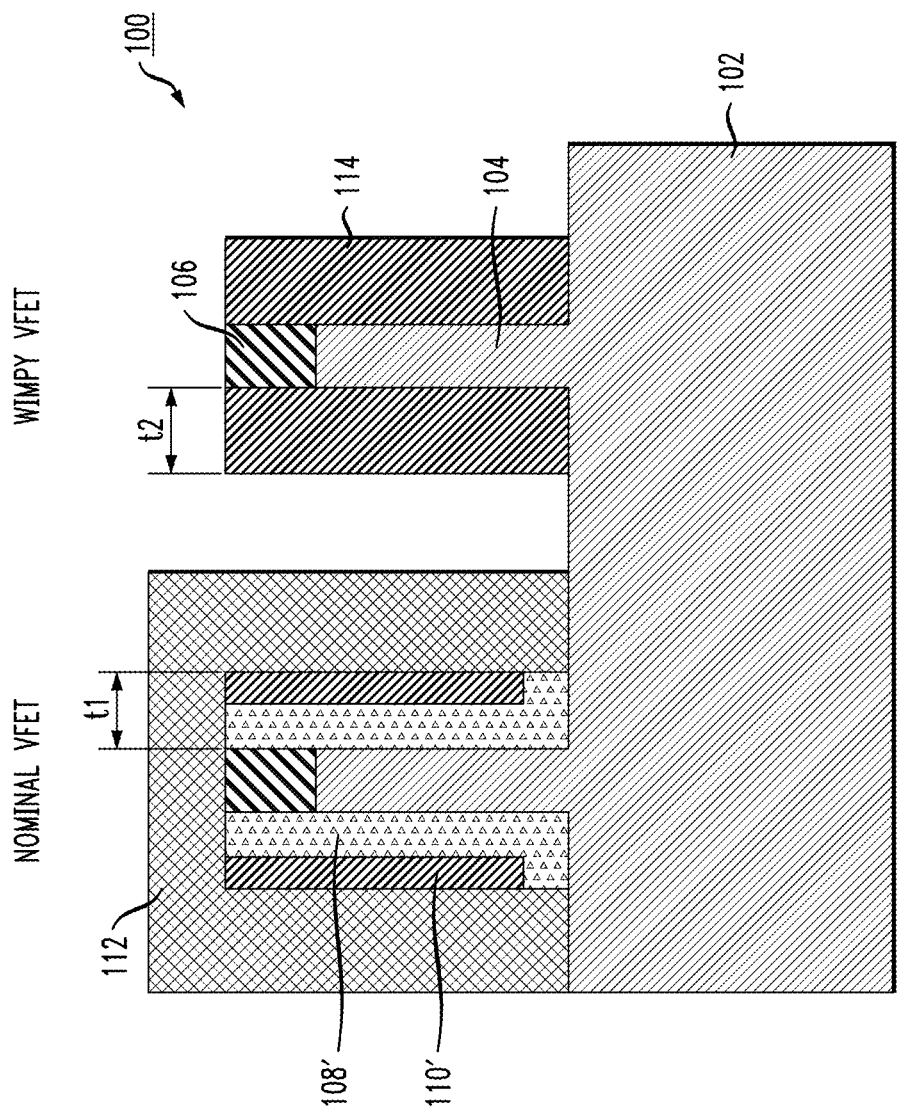
FIG. 7 is a cross-sectional view illustrating spacer formation in a wimpy VFET device region in a method of manufacturing a semiconductor device, according to an exemplary embodiment of the present invention.

FIG. 7 is a cross-sectional view illustrating spacer formation in a wimpy VFET device region in a method of manufacturing a semiconductor device, according to an exemplary embodiment of the present invention. Referring to FIG. 7, spacers 114 are formed on the substrate 102 along the vertical sides of the fin 104 and hardmask 106 in the wimpy VFET device region. In accordance with an embodiment of the present invention, the spacers 114 comprise the same or similar material to that of the spacers 110'. The spacers 114 are formed using, for example, deposition techniques including, but not limited to, CVD, PECVD, RFCVD, PVD, ALD, MLD, MBD, PLD, LSMCD, sputtering, and/or plating to deposit the spacer material, followed by a directional removal process, such as, for example, RIE, which removes portions of the spacer material from the substrate 102 on either side of the spacers 114, and from on top of the hardmask 106. In accordance with an embodiment of the present invention, a thickness t2 of the spacers 114 in the wimpy VFET device region is the same or substantially the same as the combined thickness t1 of the spacers 108' and 110' in the nominal VFET device region.

Figure 8:
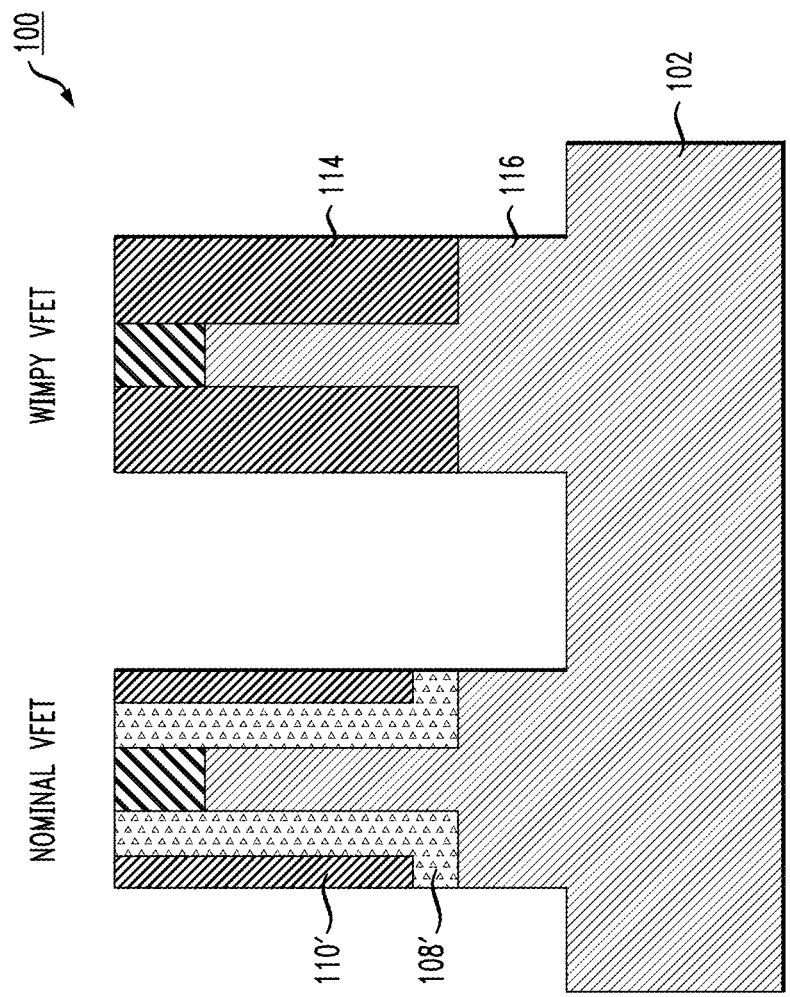
FIG. 8 is a cross-sectional view illustrating mask removal and substrate recessing in a method of manufacturing a semiconductor device, according to an exemplary embodiment of the present invention.

FIG. 8 is a cross-sectional view illustrating mask removal and substrate recessing in a method of manufacturing a semiconductor device, according to an exemplary embodiment of the present invention. Referring to FIG. 8, the mask 112 over the nominal VFET device region is removed using, for example, oxygen plasma ashing if the mask 112 is carbon-based material such as amorphous carbon or an OPL, followed by recessing portions of the substrate 102 not covered by the hardmasks 106, and the spacers 108', 110' and 114. The recessing of the substrate 102 leaves pedestal portions 116 aligned under the spacer and fin structures in the nominal and wimpy VFET device regions, each pedestal portion 116 having the width of the fin 104 plus the width of the spacers 108' and 110' or spacers 114 alongside the fin 104. The recessing of the substrate 102 is performed using directional RIE with fluorine or chlorine-based gases.

Figure 9:
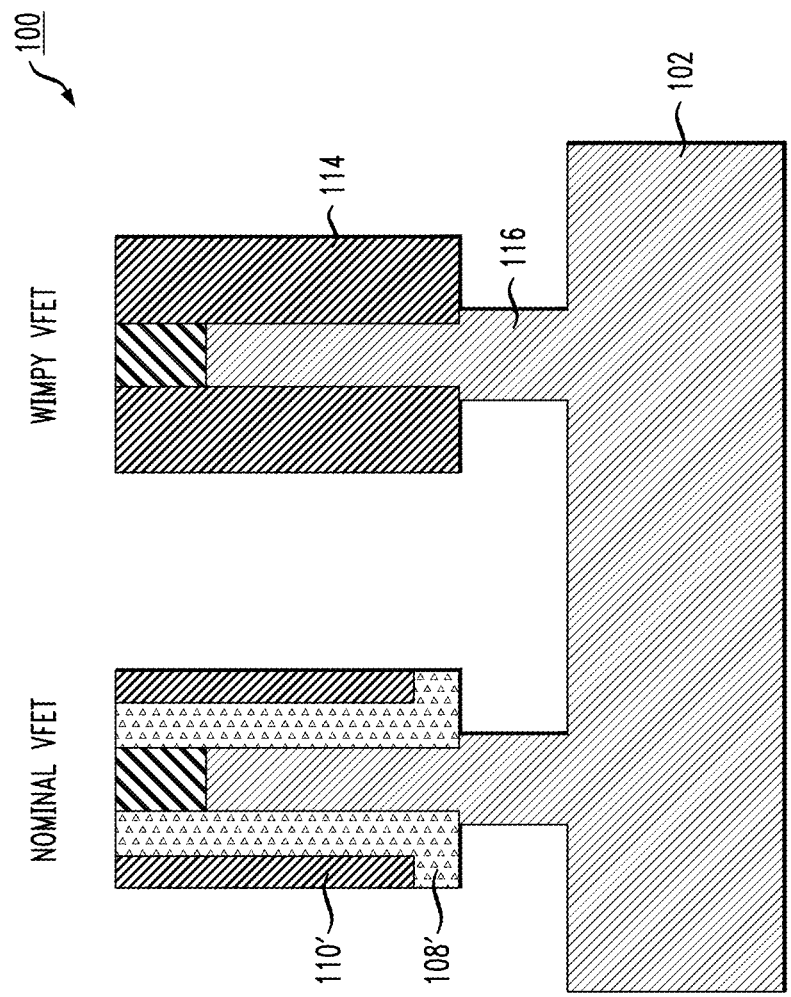
FIG. 9 is a cross-sectional view illustrating lateral trimming of portions of the substrate adjacent bottom portions of the fin in a method of manufacturing a semiconductor device, according to an exemplary embodiment of the present invention.

FIG. 9 is a cross-sectional view illustrating lateral trimming of portions of the substrate adjacent bottom portions of the fin in a method of manufacturing a semiconductor device, according to an exemplary embodiment of the present invention. Referring to FIG. 9, following the recessing described in connection with FIG. 8, the pedestal portions 116 adjacent bottom portions of the fins 104, are trimmed to a width slightly wider than a width of the fins 104 using, for example, isotropic etch or oxidation processes. For example, a width of the fins 104 may be in the range of about 5 nm to about 20 nm, while a width of the trimmed pedestal portions 116 may be in the range of about 5 nm to about 20 nm.

In the case of isotropic etching, the pedestal portions 116 are trimmed to the desired width using for example, a suitable etch process selective to dielectric materials such as the fin hardmasks 106 and the materials of the spacers 108', 110' and 114 on fin sidewalls. In some embodiments, the etch is an isotropic process such as plasma etch, gas phase etch (e.g., hydrogen chloride (HCl)), or wet etch. The trimming process also etches the substrate vertically.

In the case of oxidation, the pedestal portions 116 are laterally trimmed to the desired width using for example, any suitable oxidation process such as thermal oxidation to convert a portion of the pedestal portions 116 into an oxide, and then an oxide etch process (e.g., a wet etch process comprising hydrogen fluoride acid, or chemical oxide etch) to remove the oxide.

Figure 10:
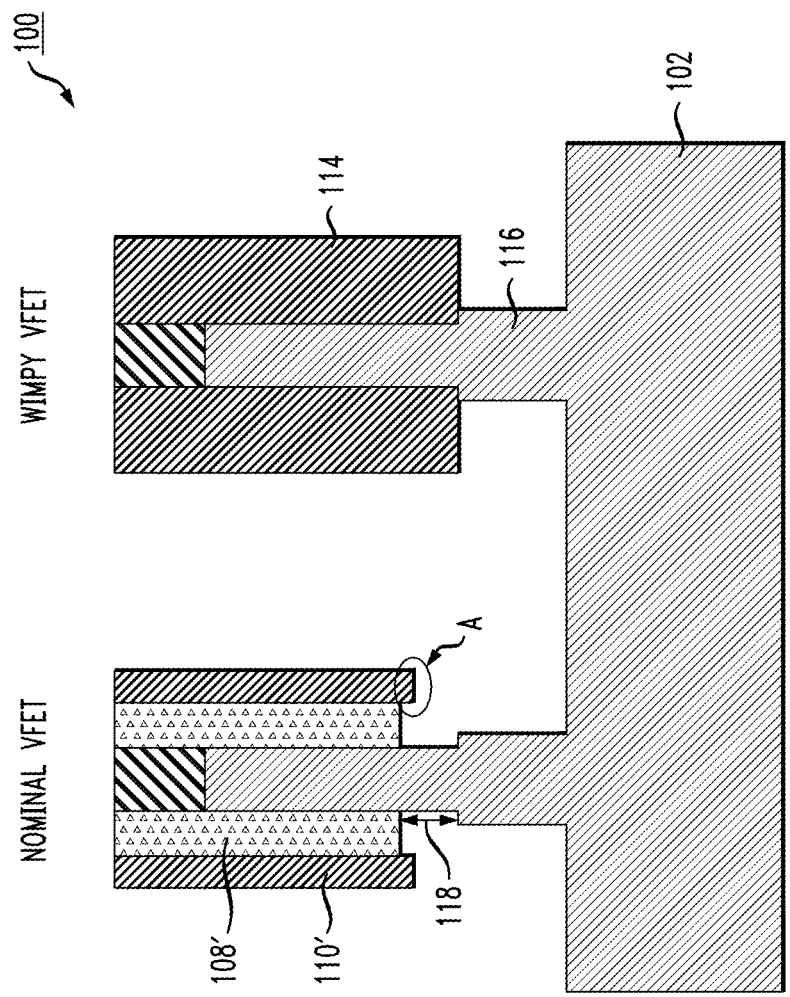
FIG. 10 is a cross-sectional view illustrating removal of portions of the first dielectric in the nominal VFET device region in a method of manufacturing a semiconductor device, according to an exemplary embodiment of the present invention.

FIG. 10 is a cross-sectional view illustrating removal of portions of the first dielectric in the nominal VFET device region in a method of manufacturing a semiconductor device, according to an exemplary embodiment of the present invention. Referring to FIG. 10, a selective etch of the spacers 108' (e.g., oxide) with respect to the spacers 110' and 114 (e.g., nitride) is performed, which, according to an embodiment of the present invention, creates overhangs (e.g., circled portion A) in the nominal VFET device region, where bottom parts of the spacers 110' extend lower than bottom parts of the spacers 108' after etching. In other words, the bottom surfaces of the spacers 108' are recessed upwards with respect to the bottom parts of the spacers 110'. As shown in FIG. 10, the removed portions of the spacers 108' expose a portion 118 of the fin 104 between top surfaces of the pedestal portion 116 and lower surfaces of the spacers 108' where, as described further in connection with FIG. 11, a bottom source/drain region 120 will be epitaxially grown. The portion 118, which will be filled in by part of the bottom source/drain region 120, represents an amount by which the gate length of the fin 104 in the nominal VFET device region is less than a gate length of the fin 104 in the wimpy VFET device region ($\Delta L_{gate}$). The selective removal of the spacers 108' in the nominal VFET device region allows the resulting vertical transistor in the nominal VFET device region to have a shorter gate length than that of the resulting vertical transistor in the wimpy VFET device region. In accordance with an embodiment of the present invention, $\Delta L_{gate}$ is in the range of about 1.5 nm to about 5 nm. The selective removal of the spacers 108' in the nominal VFET device region is performed using an etching process such as wet etch process, containing hydrofluoric acid, or a dry etch such as chemical oxidation removal (COR) process.

Figure 11:
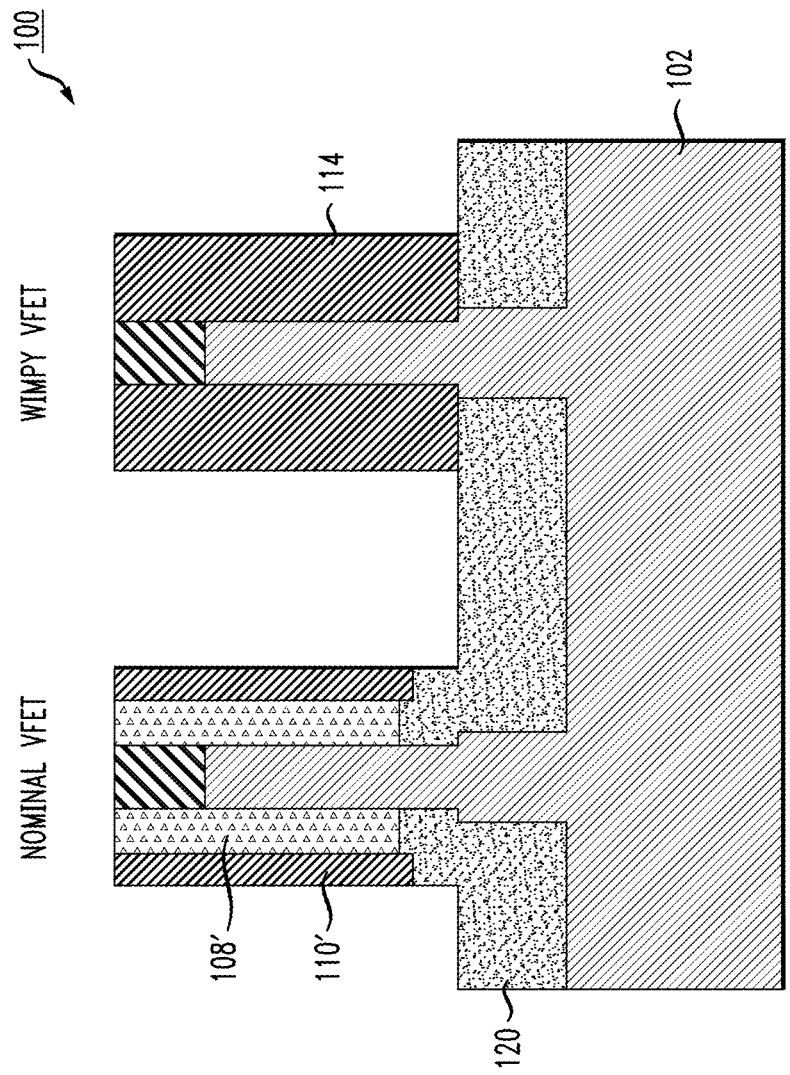
FIG. 11 is a cross-sectional view illustrating bottom source/drain formation in a method of manufacturing a semiconductor device, according to an exemplary embodiment of the present invention.

FIG. 11 is a cross-sectional view illustrating bottom source/drain formation in a method of manufacturing a semiconductor device, according to an exemplary embodiment of the present invention. Referring to FIG. 11, a bottom source/drain regions 120 is formed in the nominal and wimpy VFET device regions in the recessed portions of the substrate 102 and around the pedestal portions 116. In the nominal VFET device region, the bottom source/drain regions 120 is further formed around the exposed bottom portion of the fin 104 under the bottom surfaces of the spacers 108', including adjacent and under the overhanging portions of the spacers 110'. The bottom source/drain region 120 can be formed by an epitaxial growth processes. The epitaxially grown bottom source/drain region 120 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

As can be seen in FIG. 11, unlike the bottom source drain region 120 in the wimpy VFET device region, the bottom source/drain region 120 in the nominal VFET device region has stepped or L-shapes and is located on sides of the fin 104. The location of the bottom source/drain region 120 on sides of the fin 104 result in a shorter diffusion length, and faster dopant diffusion into the fin during junction annealing than in conventional structures. As a result, the embodiments of the present invention result in a lower diffusion gradient in the nominal VFET device region than in conventional arrangements.

Figure 12:
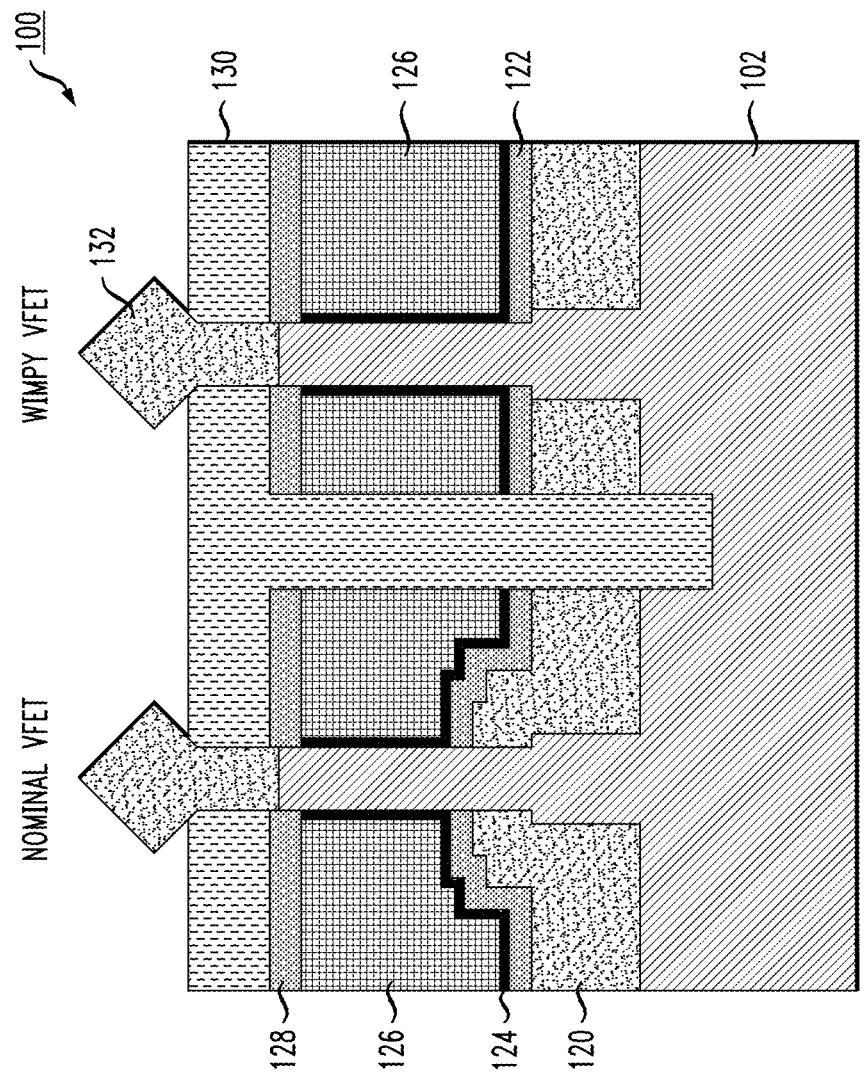
FIG. 12 is a cross-sectional view illustrating bottom spacer, isolation region, gate structure, top spacer, inter-level dielectric (ILD) and top source/drain formation in a method of manufacturing a semiconductor device, according to an exemplary embodiment of the present invention.

FIG. 12 is a cross-sectional view illustrating bottom spacer, isolation region, gate structure, top spacer, inter-level dielectric (ILD) and top source/drain formation in a method of manufacturing a semiconductor device, according to an exemplary embodiment of the present invention. Referring to FIG. 12, following removal of the spacers 108', 110' and 114, a bottom spacer layer 122 is formed on the bottom source/drain region 120. The bottom spacer layer 122 includes, but is not necessarily limited to, silicon boron nitride (SiBN), siliconborocarbonitride (SiBCN), silicon oxycarbonitride (SiOCN), SiN or $SiO_x$. According to an embodiment of the present invention, the bottom spacer layer 122 is deposited using, for example, directional deposition techniques, including, but not necessarily limited to high density plasma (HDP) deposition and gas cluster ion beam (GCM) deposition. The directional deposition deposits the spacer material preferably on the exposed horizontal surfaces, but not on lateral sidewalls. Alternatively, the spacer material can be deposited using, conformal deposition techniques, and removed from vertical surfaces using directional removal techniques, such as, for example, RIE. Spacer material formed on horizontal surfaces of the hardmasks 106 can be removed using a planarization process, such as, for example, chemical mechanical polishing (CMP).

Trenches are formed in the substrate 102, by for example, a wet or dry etch process to form isolation regions, such as shallow trench isolation (STI) regions. A dielectric material layer including, but not necessarily limited to $SiO_x$, low-temperature oxide (LTO), high-temperature oxide (HTO), flowable oxide (FOX), silicon oxycarbide (SiOC), silicon oxycarbonitride (SiOCN) or some other dielectric, is formed in the trenches to define the isolation regions.

Gate metal layers 126 are deposited on gate dielectric layers 124. The gate dielectric layers 124 include, for example, a high-K material including but not necessarily limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide). The gate metal layers 126 include, but are not necessarily limited to, for n-type devices, TiN, titanium aluminum nitride (TiAlN), titanium aluminum carbon nitride (TiAlCN), titanium carbide (TiC), titanium aluminum carbide (TiAlC), tantalum aluminum carbide (TaAlC), tantalum aluminum carbon nitride (TaAlCN) or lanthanum (La) doped TiN, TaN, and for p-type devices, titanium nitride (TiN), tantalum nitride (TaN) or ruthenium (Ru). The gate metal layers 126 are deposited using, for example, deposition techniques including, but not limited to, CVD, PECVD, RFCVD, PVD, ALD, MLD, MBD, PLD, LSMCD, sputtering, and/or plating The gate metal and gate dielectric layers 126 and 124 are conformally deposited on the bottom spacer layer 122 and on and around the fins 104 including the hardmasks 106 thereon. An isotropic etch is performed to recess the gate structure, including the gate metal and gate dielectric layers 126 and 124.

A top spacer layer 128 is formed on the recessed gate metal layers 126, and on and around the fins 104 including the hardmasks 106 thereon. The top spacer layer 128 includes, but is not necessarily limited to, silicon nitride (SiN), silicon boron nitride (SiBN), siliconborocarbonitride (SiBCN), or silicon oxycarbonitride (SiOCN). According to an embodiment of the present invention, the top spacer layer 128 is conformally deposited using, for example, deposition techniques including, but not limited to, CVD, PECVD, RFCVD, PVD, ALD, MLD, MBD, PLD, LSMCD, sputtering, and/or plating.

A dielectric material, including, but not limited to $SiO_x$, LTO, HTO, FOX or some other dielectric, is deposited to form an ILD layer 130 on the recessed gate structures, including the top spacer 128, and between the nominal and wimpy VFET device regions. The ILD layer 130 can be deposited using deposition techniques including, but not limited to, CVD, PECVD, RFCVD, PVD, ALD, MLD, MBD, PLD, and/or LSMCD, sputtering, and/or plating. Planarization, for example, CMP can be performed to remove excess material from layer 130 and planarize the resulting structure. The planarization can be performed down to the hardmasks 106 on the fins 104. In accordance with an embodiment of the present invention, the ILD layer 130 electrically isolates transistors in the nominal and wimpy VFET device regions from each other so that each transistor in the nominal and wimpy VFET device regions effectively has its own set of bottom and top source/drain regions 120 and 132, bottom and top spacers 122 and 128 and gate structures including the gate metal and gate dielectric layers 126 and 124.

The hardmasks 106 are selectively removed, using for example, a selective etch process. The selective etch process can include, for example, fluorinated gas (such as $SF_6$, $CH_4$, or $CHF_3$) based dry etching or hot phosphoric acid ($H_3PO_4$) etching. Then, upper portions of the ILD layer 130 are removed using, for example, another selective etching process, such as a selective oxide etch using, for example, $F/NH_3$ based dry etching. The removal of the upper portions of the ILD 130 exposes upper portions of the fins 104 so that top source/drain regions 132 can be epitaxially grown.

The top source/drain regions 132 are epitaxially grown in epitaxial growth processes from the upper portions of the fins 104. The epitaxially grown top source/drain regions 132 can be in-situ doped. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$. Junction annealing is also performed in connection with bottom and top source/drain regions 120 and 132.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A vertical transistor device, comprising:
a first vertical transistor comprising a first channel region on a semiconductor substrate, wherein the first vertical transistor has a first gate length;
a second vertical transistor comprising a second channel region on the semiconductor substrate, wherein the second vertical transistor has a second gate length longer than the first gate length; and
bottom source/drain regions disposed adjacent bottom portions of each of the first and second channel regions;
wherein the bottom source/drain region corresponding to the first channel region comprises a stepped shape comprising at least two steps on a side of the first channel region;
wherein a height of the bottom source/drain region corresponding to the first channel region at the stepped shape is greater than a height of the bottom source/drain region corresponding to the second channel region; and
wherein a first portion of a top surface of the bottom source/drain region corresponding to the first channel region is at a same height as a top surface of the bottom source/drain region corresponding to the second channel region.

2. The vertical transistor device according to claim 1, wherein the difference between the first and second gate lengths corresponds to the difference in the heights between the bottom source/drain region corresponding to the first channel region and the bottom source/drain region corresponding to the second channel region.

3. The vertical transistor device according to claim 2, wherein the bottom source/drain region corresponding to the first channel region is disposed on a lateral side of a fin comprising the first channel region.

4. The vertical transistor device according to claim 3, wherein the fin is disposed on a pedestal portion having a greater width than the fin.

5. The vertical transistor device according to claim 4, wherein the stepped shape comprising the at least two steps further comprises a stepped portion between the pedestal portion and the fin.

6. The vertical transistor device according to claim 1, wherein a second portion of the top surface of the bottom source/drain region corresponding to the first channel region comprises the stepped shape, and the top surface of the bottom source/drain region corresponding to the second channel region comprises a flat shape.

7. The vertical transistor device according to claim 1, further comprising a spacer layer formed along the stepped shape.

8. The vertical transistor device according to claim 7, further comprising a gate dielectric layer formed on the spacer layer along the stepped shape.

9. The vertical transistor device according to claim 1, wherein the first vertical transistor is adjacent the second vertical transistor on the semiconductor substrate.

10. A semiconductor device, comprising:
a first vertical transistor comprising a first vertical channel region on a semiconductor substrate, wherein the first vertical transistor has a first gate length;
a second vertical transistor comprising a second vertical channel region on the semiconductor substrate, wherein the second vertical transistor has a second gate length longer than the first gate length; and
bottom source/drain regions disposed adjacent bottom portions of each of the first and second vertical channel regions;
wherein the bottom source/drain region corresponding to the first vertical channel region comprises a stepped shape comprising at least two steps on a side of the first vertical channel region;
wherein a portion of a top surface of the bottom source/drain region corresponding to the first vertical channel region at the stepped shape is at greater height than a height of a top surface of the bottom source/drain region corresponding to the second vertical channel region; and wherein another portion of the top surface of the bottom source/drain region corresponding to the first vertical channel region is at a same height as the top surface of the bottom source/drain region corresponding to the second vertical channel region.

11. The semiconductor device according to claim 10, wherein the difference between the first and second gate lengths corresponds to the difference in the heights between the portion of the top surface of the bottom source/drain region corresponding to the first vertical channel region and the top surface of the bottom source/drain region corresponding to the second vertical channel region.

12. The semiconductor device according to claim 11, wherein the bottom source/drain region corresponding to the first vertical channel region is disposed on a lateral side of a fin comprising the first vertical channel region.

13. The semiconductor device according to claim 12, wherein the fin is disposed on a pedestal portion having a greater width than the fin.

14. The semiconductor device according to claim 13, wherein the the stepped shape comprising the at least two steps further comprises a stepped portion between the pedestal portion and the fin.

15. The semiconductor device according to claim 10, wherein the top surface of the bottom source/drain region corresponding to the second vertical channel region comprises a flat shape.

16. The semiconductor device according to claim 10, further comprising a spacer layer formed along the stepped shape.

17. The semiconductor device according to claim 16, further comprising a gate dielectric layer formed on the spacer layer along the stepped shape.

18. The semiconductor device according to claim 10, wherein the first vertical transistor is adjacent the second vertical transistor on the semiconductor substrate.

\* \* \* \* \*